US 6,828,213 B2

(12) United States Patent
Mehrad et al.

(10) Patent No.: US 6,828,213 B2
(45) Date of Patent: Dec. 7, 2004

(54) METHOD TO IMPROVE STI NANO GAP FILL AND MOAT NITRIDE PULL BACK

(75) Inventors: Freidoon Mehrad, Plano, TX (US); Zhihao Chen, Plano, TX (US); Majid M. Mansoori, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/376,021

(22) Filed: Feb. 28, 2003

(65) Prior Publication Data

US 2003/0181022 A1 Sep. 25, 2003

Related U.S. Application Data

(60) Provisional application No. 60/365,832, filed on Mar. 21, 2002.

(51) Int. Cl.[7] .................................. H01L 21/76
(52) U.S. Cl. ...................................... 438/435
(58) Field of Search ........................... 438/424, 435, 438/700, 443

(56) References Cited

U.S. PATENT DOCUMENTS 4,352,724 A * 10/1982 Sugishima et al. .... 204/192.37
6,319,794 B1 * 11/2001 Akatsu et al. ............... 438/424
6,339,004 B1 * 1/2002 Kim ........................... 438/296
6,368,931 B1 * 4/2002 Kuhn et al. ................. 438/359
6,461,937 B1 * 10/2002 Kim et al. ................... 438/431
6,465,866 B2 * 10/2002 Park et al. ................... 257/510
2002/0003275 A1 * 1/2002 Lee et al. .................... 257/510

OTHER PUBLICATIONS

Stanley Wolf Silicon Processing for the VSLI Era vol. 2 Lattice Press 1990 pp. 52–53.*

* cited by examiner

Primary Examiner—David S. Blum
(74) Attorney, Agent, or Firm—W. James Brady, III; Frederick J. Telecky, Jr.

(57) ABSTRACT

A method of improving shallow trench isolation (STI) gap fill and moat nitride pull back is provided by after the steps of growing a pad oxide, depositing a nitride layer on the pad oxide and the steps of moat patterning, moat etching and moat clean, the steps of growing thermal oxide, deglazing a part of a part of the moat nitride; depositing a thin nitride liner, etching the nitride to form a thin side wall nitride in the STI trench; and performing an oxide Hydroflouric (HF) acid deglazing before STI liner oxidating and depositing oxide to fill the trench.

9 Claims, 4 Drawing Sheets

FIG. 10

METHOD TO IMPROVE STI NANO GAP FILL AND MOAT NITRIDE PULL BACK

This application claims priority under 35 USC § 119(e)(1) of provisional application No. 60/365,832 filed Mar. 21, 2002.

FIELD OF INVENTION

This invention relates generally to semiconductor devices and more particularly to method of forming shallow trench isolation (STI) structures and to side wall nitride formation in shallow trench isolation to provide a more uniform STI oxide liner and to also make a moat nitride pullback possible.

BACKGROUND OF THE INVENTION

In the fabrication of semiconductor devices, isolation structures are formed between active areas in which electrical devices such as transistors, memory cells, or the like, are to be formed. The isolation structures are typically formed during initial processing of a semiconductor substrate, prior to the formation of such electrical devices. Typical isolation techniques include local oxidation of silicon (LOCOS) and shallow trench isolation (STI) processes, by which isolation structures are formed between active regions of a semiconductor device. As semiconductor device dimensions have been reduced over the past several years, limitations on the scalability of and other problems associated with LOCOS isolation techniques, have resulted in a general trend away from LOCOS techniques and an increase in the use of STI techniques, particular in modem, high device density applications.

STI isolation techniques involve the formation of shallow trenches in the isolation areas or regions of a semiconductor wafer, which are subsequently filled with dielectric material such as silicon dioxide (SiO2) to provide electrical isolation between devices subsequently formed in the active regions on either side of the filled trenches. A pad oxide layer and a nitride layer are typically formed over the substrate surface and patterned to expose only the isolation regions, with the prospective active device regions covered. The nitride layer operates as a hard mask during subsequent processing steps, and the pad oxide layer functions to relieve stress between the underlying silicon substrate and the nitride layer. An anisotropic (e.g., "dry") etch is then performed to form a trench through the nitride, pad oxide, and substrate. Once the trench is etched, dielectric material is deposited to fill the trench with oxide. Thereafter, the device is commonly planarized using a chemical mechanical polishing (CMP) process and the nitride protection layer is removed.

A conventional STI process is illustrated in FIGS. 1–7 to form trench isolation structures in a semiconductor device 12. In FIG. 1, a thermal oxidation process is used to grow a pad oxide layer 14 over a semiconductor substrate 16. A nitride layer 18, such as Si3N4 is then deposited in FIG. 2, such as by low pressure chemical vapor deposition (LPCVD). The nitride layer 18 is used to protect the active regions of the substrate 16 from adverse effects of the subsequent formation of isolation trenches between the active regions. The active regions of the device 12 are then masked in FIG. 3 using a patterned etch mask 20, leaving the isolation region of the nitride layer 18 exposed. A dry etch 22 is performed to form a trench 24 through the nitride layer 18, the pad oxide layer 14, and into the substrate 16. The active mask 20 is then removed in FIG. 4 and an oxide liner 26 is formed in the trench 24 to remove or repair substrate damage caused by the trench etch process 22.

Once the trench 24 and the liner 26 are formed, a dielectric material 28 is deposited in FIG. 5 via a deposition process 30 to fill the trench 24 and also to coverthe nitride layer 18 in the active regions of the device 12. In FIG. 6, a chemical mechanical polishing (CMP) process 32 is used to planarize the upper surface of the device 12, which exposes the remainder of the nitride layer 18. Following planarization, the nitride layer 18 is removed via an etch process 34 in FIG. 7 to complete the isolation process. However, in conventional isolation processing, sharp corners in the isolation trench can cause various problems with the operation performance of transistors and other devices fabricated in the adjacent active regions of the device 12.

STI (Shallow Trench Isolation) is the solution for transistor isolations at quarter micron (and below) technology. In today's integrated circuit (IC) technology most products are trying to use STI as an isolation approach with much smaller dimensions/pitch where this is facing a limitation of STI gap fill in conjunction with the STI liner oxidation.

Presently with the small STI dimensions, it is getting more difficult to fill the STI trenches without any voids. Of course the main problem is the narrow STI width where in conjunction with bottle necking of the STI oxide liner it will make the filling difficult. The bottle necking of the STI liner oxidation is due to the oxide growth rate on the STI walls that have different plane orientation than the <001>. As it is seen in FIG. 8, oxide liner grown on the 87 deg walls is about 2–3 times of the intended oxidation thickness where it is about 50% of the intended thickness at the bottom of the STI.

On the other hand, the STI oxide recess at moat corners are known to cause problems for inverse narrow width effect. The STI oxide loss is due to the subsequent oxide deglazes in the process post STI fill and CMP where in effect the STI oxide will recess below the silicon surface. When the poly-silicon is deposited and etched to form the gate of a transistor, there will be a sharp moat corner under the gate poly as it is seen in FIG. 9.

Also in this figure it is shown the STI gap fill void 91 which was mentioned above. It is well known in the industry that the STI oxide recess can be avoided if the moat nitride was pulled back (etched with hot phosphoric acid) prior to the STI gap fill. But this approach has its own problems when it is integrated with the STI nitride liner. This STI nitride liner is needed for stress reduction in the STI. But if the STI nitride liner is present in the process, unintentionally a part of this nitride liner will be deglazed during the moat nitride removal. This is a problem where finally poly will be deposited in the void which was left behind after nitride liner was deglazed.

SUMMARY OF INVENTION

In accordance with one embodiment of the present invention:
1) A method to reduce oxide growth on STI walls is provided by depositing and etching a nitride liner to create a thin side wall prior to the STI liner oxidation.
2) A method to make the moat nitride pull back process possible in the present of the STI nitride liner process for STI stress reduction is provided by depositing and etching a nitride liner to create a thin side wall nitride prior to the STI gap fill.

DESCRIPTION OF THE PREFERRED EMBODIMENT OF THE INVENTION

Figure 1:
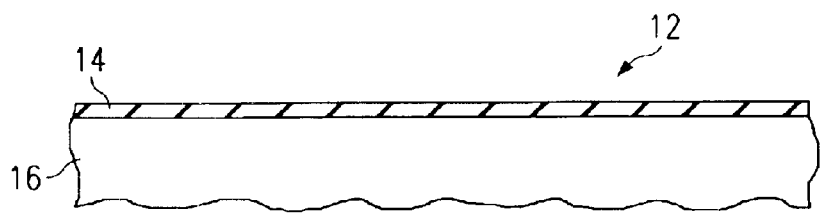
FIGS. 1–7 are partial side elevation views in section illustrating a conventional shallow trench isolation process for providing isolation between active areas in a semiconductor device.
Figure 2:
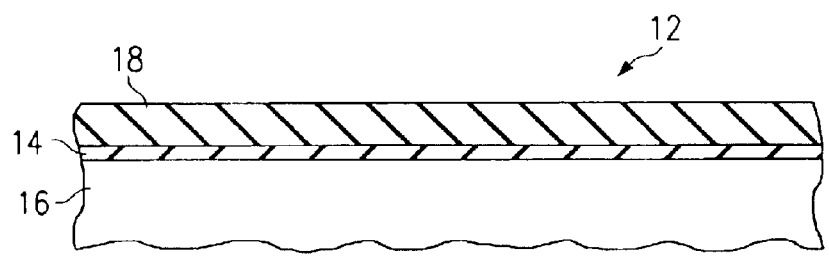
Figure 3:
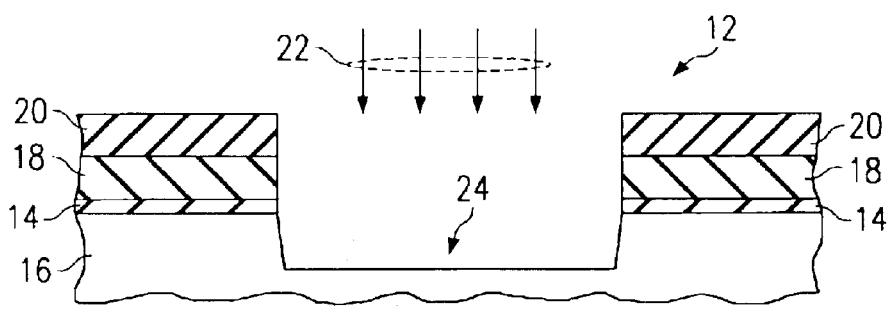
Figure 4:
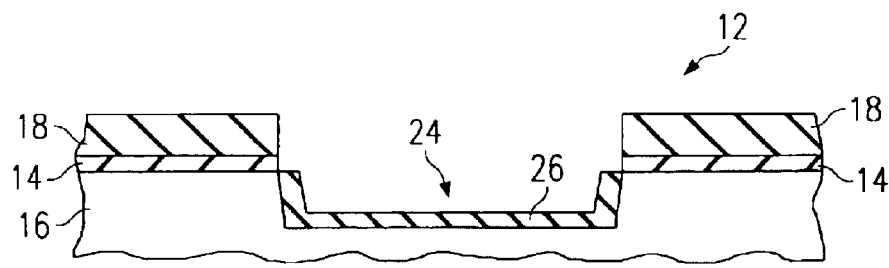
Figure 5:
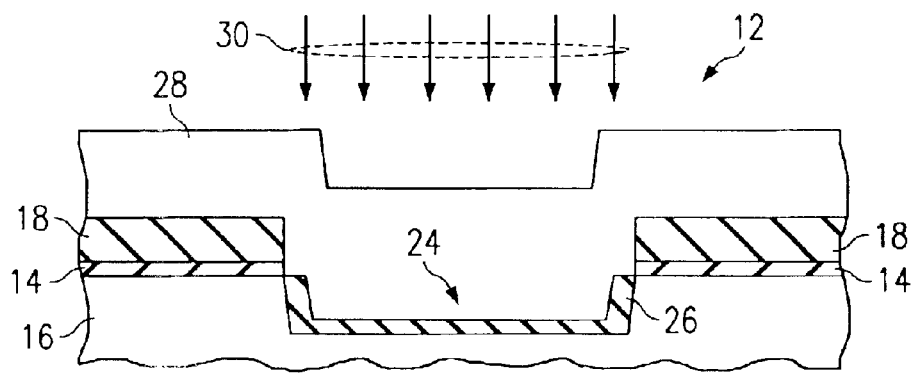
Figure 6:
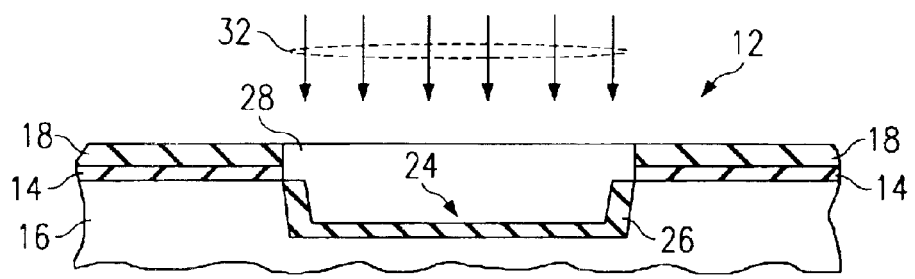
Figure 7:
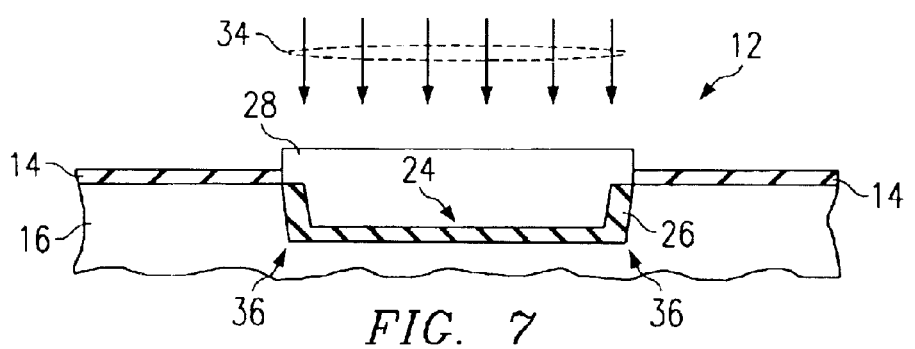
Figure 8:
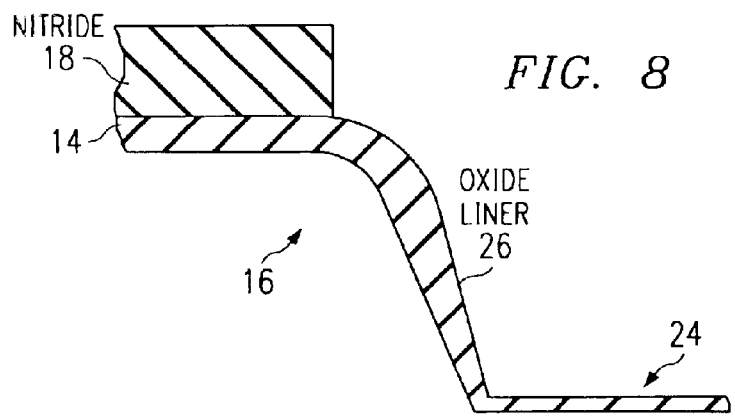
FIG. 8 is an STI trench post liner oxidation.

Before describing the preferred embodiment of the present invention a description of the following is the present process sequence for STI formation.

A. Grow a pad oxide on the face of silicon wafers. The pad oxide layer may be formed using any appropriate oxidation processes as are known such as a thermal oxidation growth or a deposition process. The pad oxide layer may function to relieve stress between the underlying silicon substrate and the overlying nitride layer to follow.

B. Deposit a nitride layer on top of the pad oxide. The nitride layer operates as a hard mask in subsequent isolation processing to protect the underlying active regions of the substrate. The nitride layer may be formed using any appropriate deposition techniques and materials such as $Si_3N_4$ deposited by low pressure chemical vapor deposition (LPCVD).

C. Pattern (resist coat, exposure and develop) the moat. A resist layer is formed over the nitride layer, and patterned to form a patterned mask exposing isolation regions of the substrate, while covering the active regions. The patterning of the resist mask may be done according to known photolithography methodologies such as by exposing select portions of the resist to a radiation source through a photomask, and removing either the exposed or the unexposed portions of the resist material so as to uncover a portion of the nitride layer in the isolation regions and to leave the active regions covered.

D. Etch the nitride, oxide and silicon to form the shallow trench. An isolation trench is dry etched using the patterned mask formed. The trench etch may be carried out using known trench etching techniques such as reactive ion etching (RIE). For example, a multi-step RIE etch process may be performed which removes material in the exposed isolation regions so as to etch through the nitride layer, the underlying pad oxide, and into the semiconductor substrate so as to form a trench having sidewalls, a bottom, and lower corners therebetween. For instance, a first dry etch may be employed to remove the nitride and oxide material in the isolation region so as to expose the silicon wafer surface. Thereafter, a second dry etch may be performed to remove the silicon surface area through the openings in the mask to form a trench therein.

E. Resist clean up.

F. Hydroflouric (HF) acid deglaze for STI oxide liner under cut. This is to clean the STI silicon surface prior to the oxide liner growth and also it deglazes a part of the pad oxide under the moat nitride for stress release.

G. Grow an oxide liner.

H. Deposit oxide to fill the STI trenches. The trench is filled with dielectric material such as $SiO_2$ or other electrically isolating material so as to provide electrical isolation between active regions on either side of the isolation trench. The trench filling operation may comprise forming or depositing dielectric material over the device to cover the nitride layer in the active regions and to fill the trenches in the isolation regions thereof. The trench fill material may be deposited using any appropriate material.

I. CMP (Chemical Mechanical Polishing) of the STI oxide where the moat nitride is an stopping layer for CMP.

J. Moat nitride etch (Hot Phosphoric acid).

K. Grow dummy oxide, HF deglaze, grow high voltage (HV) gate, HF deglaze and grow low voltage (LV) gate oxide.

L. Deposit polysilicon and form the transistor gates.

Figure 9:
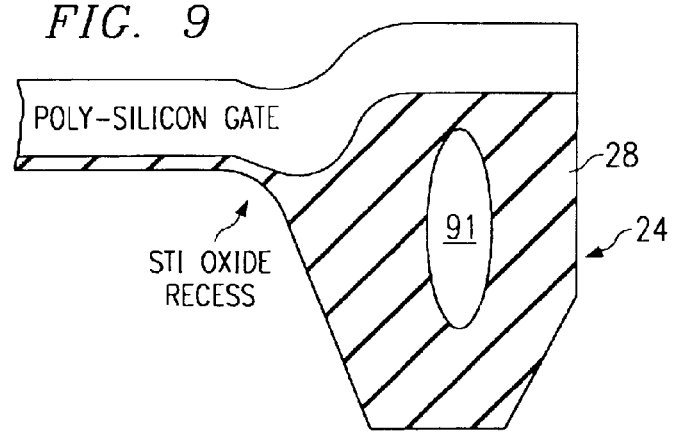
FIG. 9 is a moat corner with STI oxide recess.

The difficulties that might occur are:

a. At step G, the oxide liner is not grown uniformly around the STI trench due to the different silicon plane orientations where this in effect will cause problems at step H for the gap fill and it will cause a void 91 in the STI fill as it is shown in FIG. 9.

b. At step K, all the oxide deglazes in the standard process, will also remove the STI oxide from top and from the sides. If some STI oxide is removed from the top, it will not cause any problems. But the STI oxide recess at the moat corners will cause problems for the transistors where, in effect, the sharp moat corners will cause the inverse narrow width effect. This is shown in FIG. 9.

In accordance with one embodiment of the present invention:

1) A method to reduce oxide growth on STI walls is provided by depositing and etching a nitride liner 101 to create a thin side wall prior to the STI liner oxidation.

2) A method to make the moat nitride pull back process possible in the presence of the STI nitride liner process for STI stress reduction is provided by depositing and etching a nitride liner to create a thin side wall nitride 101 prior to the STI gap fill.

The present invention teaches a preferred "process method" for the STI loop processes in order to obtain a much more process capability for the STI gap fill by suppressing the oxide growth rate on STI walls and also make the moat nitride pull back possible to solve the STI oxide recess problem at the moat corners. This preferred method can be used to solve the above two problems separately or both.

Figure 11:
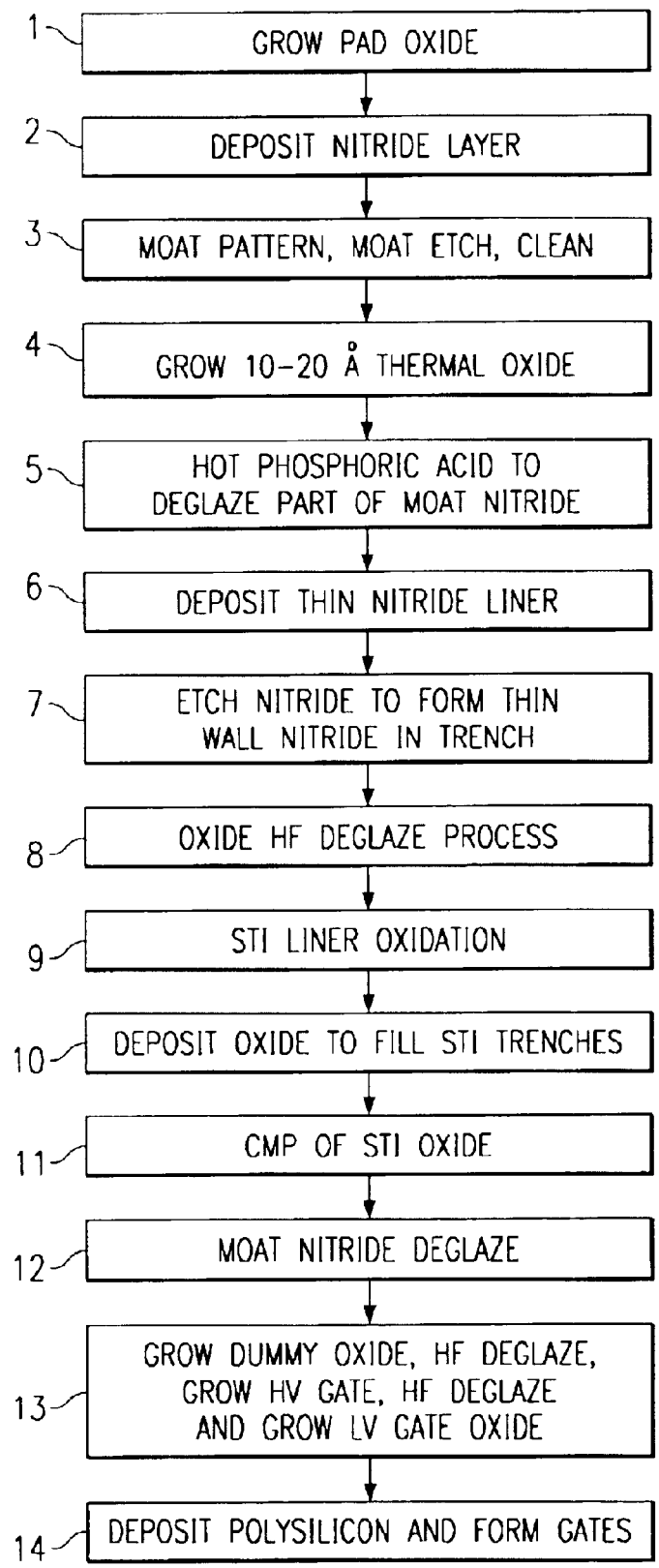
FIG. 11 is a flow chart of the process in accordance with a preferred embodiment of the present invention.

The combined process steps (illustrated in FIG. 11) to solve the nonuniformity of the STI oxide liner growth and moat nitride pull back are as follows:

1. Grow a pad oxide on the face of silicon wafers as discussed previously.
2. Deposit a nitride layer on top of the pad oxide as discussed previously.
3. Moat pattern, moat etch and moat etch clean are done per base line. This is steps C–E discussed above.
4. Grow 20–40 Angstroms of thermal oxide (For good silicon-oxide interface, also it prevents silicon loss or roughening of silicon surface during the hot phosphoric wet moat nitride pull back).
5. Use hot phosphoric acid to etch a part of the moat nitride. Therefore the moat nitride will be thinner on the top and also it will pull back laterally. This lateral removal of moat nitride will be filled with the STI gap fill later, where, in effect, prevents the STI oxide recess at the moat corners.
6 Deposit a very thin nitride liner 101 (30–60 Angstroms).
7 Perform dry nitride etch to form side wall nitride in the STI trench as illustrated by 101 in FIG. 10. Therefore the original moat nitride and the new STI side wall nitride are in effect separated where during the subsequent moat nitride 18 wet etch the STI side wall nitride 101 in the STI trench will not be affected by this wet etch.
8. Hydroflouric (HF) acid deglaze process (for under cut and moat pad oxide deglaze).

Figure 10:
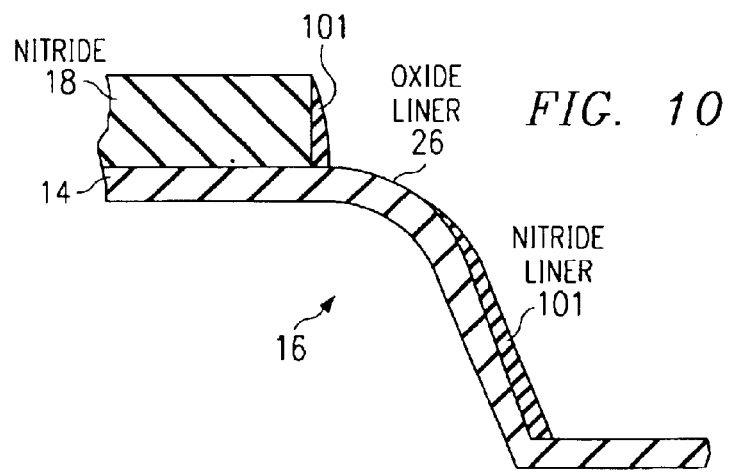
FIG. 10 is an STI trench post side wall nitride liner formation.

9. STI liner oxidation (This will grow oxide on the bottom of STI where nitride has been etched and also it will prevents too much oxide growth on the walls. Meanwhile amount of corner rounding stays the same as before. FIG. 10 depicts this process with thin nitride post nitride etch and STI liner oxidation. This side wall nitride can be left in the STI trench to reduce the stress in STI.)

The steps 10 through 14 following the STI oxide liner growth are then performed as discussed above. They are as follows:

10. Deposit oxide to fill the STI trenches.
11. CMP (Chemical Mechanical Polishing) of the STI oxide where the moat nitride is a stopping layer for CMP.
12. Moat nitride etch (Hot Phosphoric acid).
13. Grow dummy oxide, HF deglaze, grow HV gate, HF deglaze and grow LV gate oxide.
14. Deposit polysilicon and form the transistor gates.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having', "has", "with", or variants thereof are used in either the detailed description and the claims, such terms are intended to be inclusive in a manner similar to the term "comprising."

What is claimed is:

1. A method of STI formation on a silicon wafer comprising the steps of:
   growing pad oxide on the face of the silicon wafer;
   deposit nitride layer on said pad oxide;
   moat patterning, moat etching and moat etch cleaning;
   growing thermal oxide;
   etching a part of the moat nitride layer using hot phosphoric acid;
   depositing a very thin nitride liner;
   dry plasma etching the thin nitride liner to form a thin side wall nitride in the STI trench separated from the moat nitride layer such that during subsequent moat nitride wet etch the side wall nitride in the STI trench will not be affected;
   performing Hydrofluoric (HF) acid deglaze process; and
   performing STI liner oxidation.

2. The method of claim 1 including the step of depositing oxide to fill the STI trenches.

3. The method of claim 2 including the steps of CMP (Chemical Mechanical Polishing) of the STI oxide where the moat nitride is a stopping layer for CMP;
   moat nitride etch;
   growing dummy oxide; HF deglazing, growing HV gate, HF deglaze and grow LV gate oxide; and
   depositing polysilicon and forming the transistor gates.

4. The method of claim 1 wherein the growing thermal oxide grows 20–40 Angstroms.

5. The method of claim 1 wherein the step of depositing a very thin nitride liner is from 30–60 Angstroms.

6. The method of STI formation on a silicon wafer comprising the steps of:
   growing pad oxide on the face of the silicon wafer;
   deposit nitride layer on said pad oxide;
   moat patterning, moat etching and moat etch cleaning;
   growing thermal oxide;
   etching a part of the moat nitride layer;
   depositing a very thin nitride liner;
   dry plasma etching the thin nitride liner to form a thin side wall nitride in the STI trench separated from the moat nitride layer such that during subsequent moat nitride wet etch the side wall nitride in the STI trench will not be affected;
   deglazing for under cut and moat pad oxide deglaze; and
   performing STI liner oxidation;
   depositing oxide to fill the STI trenches;
   CMP (Chemical Mechanical Polishing) of the STI oxide where the moat nitride is a stopping layer for CMP; and
   performing moat nitride wet etch.

7. The method of claim 6 wherein the growing thermal oxide grows 20–40 Angstroms.

8. The method of claim 6 wherein the step of depositing a very thin nitride liner is from 30–60 Angstroms.

9. The method of claim 6 further including the step of:
   growing dummy oxide; HF deglazing, growing HV gate, HF deglaze and grow LV gate oxide; and
   depositing polysilicon and forming the transistor gates.

* * * * *